United States Patent
Hada

[19]

[11] Patent Number: 5,861,653
[45] Date of Patent: Jan. 19, 1999

[54] SEMICONDUCTOR DEVICE HAVING GASEOUS ISOLATING LAYER FORMED IN INTER-LEVEL INSULATING LAYER AND PROCESS OF FABRICATION THEREOF

[75] Inventor: Hiromitsu Hada, Tokyo, Japan

[73] Assignee: NEC Corporation, Tokyo, Japan

[21] Appl. No.: 644,339

[22] Filed: May 10, 1996

[30] Foreign Application Priority Data

May 11, 1995 [JP] Japan ................................. 7-135605

[51] Int. Cl.⁶ .................. H01L 21/764; H01L 27/08; H01L 29/51
[52] U.S. Cl. .................. 257/386; 257/300; 257/315; 257/314; 438/683
[58] Field of Search .................. 438/637, 675, 438/700, 723, 683; 257/760, 386, 315, 314, 300

[56] References Cited

U.S. PATENT DOCUMENTS

| | | |
|---|---|---|
| 4,987,101 | 1/1991 | Kaanta et al. . |
| 5,328,868 | 7/1994 | Conti et al. . |
| 5,413,962 | 5/1995 | Lur et al. . |
| 5,670,828 | 9/1997 | Cheung et al. . |
| 5,770,507 | 6/1998 | Chen et al. . |

FOREIGN PATENT DOCUMENTS

| | | |
|---|---|---|
| 56-32723 | 4/1981 | Japan . |
| 1238146 | 9/1989 | Japan . |

*Primary Examiner*—Caridad Everhart

[57] ABSTRACT

An inter-level insulating structure is formed by a lower silicon oxide layer, an upper silicon oxide layer and an air layer filling a gap between the lower silicon oxide layer and the upper silicon oxide layer, and the air layer decreases the effective dielectric constant so that a parasitic capacitance across the inter-level insulating structure is drastically decreased.

3 Claims, 11 Drawing Sheets

SEMICONDUCTOR DEVICE HAVING GASEOUS ISOLATING LAYER FORMED IN INTER-LEVEL INSULATING LAYER AND PROCESS OF FABRICATION THEREOF

FIELD OF THE INVENTION

This invention relates to a semiconductor device and, more particularly, to a semiconductor device having gaseous isolating layer formed in an inter-level insulating layer for decreasing an equivalent dielectric constant thereof and a process of fabrication thereof.

DESCRIPTION OF THE RELATED ART

A semiconductor integrated circuit device has a multiple-layer structure. Research and development efforts are being made for increasing the integration density of the semiconductor integrated circuit device, and the inter-level insulating layer is getting thinner and thinner. Although the thin inter-level insulating layer is desirable for an inter-level connection, a large parasitic capacitance takes place between a lower conductive layer and an upper conductive layer, and decreases the signal propagation along these conductive layers.

Material with small dielectric constant is effective against the parasitic capacitance. Most of the inter-level insulating layer is formed of silicon oxide, and the dielectric constant of the silicon oxide is 3.6 to 3.8. Although the dielectric constant of silicon oxide is small enough to form an inter-level insulating layer in the presently standard semiconductor integrated circuit device, the dielectric constant of the silicon oxide is too large to form an inter-level insulating layer incorporated in the next generation, and fluororesin has been proposed. The dielectric constant of the fluororesin ranges between 2.0 to 2.1, and an inter-level insulating layer of the fluororesin effectively decreases the parasitic capacitance.

Another approach is a floating wiring structure. Conductive wirings are supported by conductive posts, and the conductive posts form ohmic contacts with impurity regions of a component transistors. The conductive posts space the conductive wirings from the major surface of the semiconductor substrate, and a gap takes place between the major surface of the semiconductor substrate and the conductive wirings. The air fills the gaps, and decreases the parasitic capacitance.

Although the disclosed structure is not applied to a wiring, Japanese Patent Publication of Unexamined Application No. 56-32723 discloses a kind of floating structure. FIG. 1 illustrates the prior art floating structure disclosed in the Japanese Patent Publication of Unexamined Application.

A semi-insulating substrate 1 of gallium arsenide is overlain by a semiconductor active layer 2 of n-type gallium arsenide, and a recess 2a is formed in a surface portion of the semiconductor active layer 2. The upper surface of the semiconductor active layer 2 is covered with an insulating layer 3 of silicon oxide, and, accordingly, the recess 2a is closed with the insulating layer 3. A through-hole 3a is formed in the insulating layer 3, and a gate electrode 4 of aluminum passes the hole 3a so as to form a Schottky barrier with the bottom surface 2b of the semiconductor active layer 2. Vacant space takes place between the lower surface 3b of the insulating layer 3 and the bottom surface 2b of the semiconductor active layer 2. Although the gate electrode 4 spreads peripheral portions 4a and 4b on the upper surface 4c of the insulating layer 3, the vacant space 2a decreases the parasitic capacitance formed between the peripheral portions 4a/4b and the semiconductor active layer 2.

The prior art floating structure is fabricated as follows. First, the semi-insulating substrate 1 of gallium arsenide is prepared, the n-type gallium arsenide is grown on the major surface of the semi-insulating substrate 1 so as to cover the major surface with the semiconductor active layer 2.

Subsequently, the silicon oxide is deposited over the entire upper surface of the semiconductor active layer 2, and the semiconductor active layer 2 is overlain by the insulating layer 3.

An appropriate photo-resist etching mask is patterned on the upper surface of the semiconductor active layer 2, and exposes the area assigned to the through-hole 3a to an etchant. The etchant removes the silicon oxide in the uncovered area, and the through-hole 3a is formed in the insulating layer 3.

The semiconductor active layer 2 is exposed through the through-hole 3a to another etchant, and the etchant forms the recess 2a in the surface portion of the semiconductor active layer 2. The recess 2a is wider than the through-hole 3a, and the vacant space 2a takes place between the lower surface 3b of the insulating layer 3 and the bottom surface 2b of the semiconductor active layer 2.

Aluminum is vertically deposited on the upper surface of the insulating layer by using an evaporation, and the aluminum layer penetrates through the through-hole 3a so as to be piled up on the central area of the semiconductor active layer 2 beneath the through-hole 3a. The vacant space 2a takes place. The aluminum layer is patterned into the gate electrode 4, and forms the Schottky barrier with the n-type gallium arsenide of the active layer 2.

Problems are encountered in the prior art technologies as follows.

The first prior art technology using the fluororesin decreases the parasitic capacitance at 40 to 50 percent with respect to the silicon oxide. However, the reduction is dependent on the dielectric constant of the insulating substance, and is insufficient to an ultra-thin inter-level insulating layer for the next generation.

The second prior art technology using the floating structure drastically decreases the parasitic capacitance by virtue of the air in the vacant space 2a, because the dielectric constant of the air is 1. However, the prior art floating structure encounters a problem in that an upper wiring is hardly formed on the prior art gate electrode 4, and is not available for a multiple-layer wiring structure. Even if the prior art floating gates are employed, non-floating conventional wirings still suffer from large parasitic capacitance, and the signal propagation is less accelerated.

SUMMARY OF THE INVENTION

It is therefore an important object of the present invention to provide a semiconductor device which has an inter-level insulating layer for decreasing a parasitic capacitance between an upper conductive layer and a lower conductive layer.

It is also an important object of the present invention to provide a process of forming an gaseous isolating layer in an inter-level insulating layer.

To accomplish the object, the present invention proposes to form a gap in an inter-level insulating layer so as to be filled with gaseous isolating material.

In accordance with one aspect of the present invention, there is provided a semiconductor device comprising: a first conductive layer and a second conductive layer; and an inter-level insulating layer provided between the first conductive layer and the second conductive layer, and including a first insulating layer, a second insulating layer spaced from the first insulating layer for forming a gap and gaseous isolating layer filling the gap.

In accordance with another aspect of the present invention, there is provided a process of fabricating a semiconductor device having an inter-level insulating layer provided between a first conductive layer and a second conductive layer, comprising the steps of: a) forming a first layer of a first insulating material on one of the first conductive layer and the second conductive layer; b) forming a second layer of a material on the first layer; c) forming a third layer of a second insulating material on the second layer; and d) selectively etching the second layer by using an etchant having a selectivity between the first and second insulating materials and the material so as to allow a gaseous insulating layer to fill a gap between the first layer and the third layer, the first layer, the gaseous isolating layer and the third layer forming in combination the inter-level insulating layer.

BRIEF DESCRIPTION OF THE DRAWINGS

The features and advantages of the semiconductor device and the process according to the present invention will be more clearly understood from the following description taken in conjunction with the accompanying drawings in which.

DESCRIPTION OF THE PREFERRED EMBODIMENTS

First Embodiment

Figure 1:
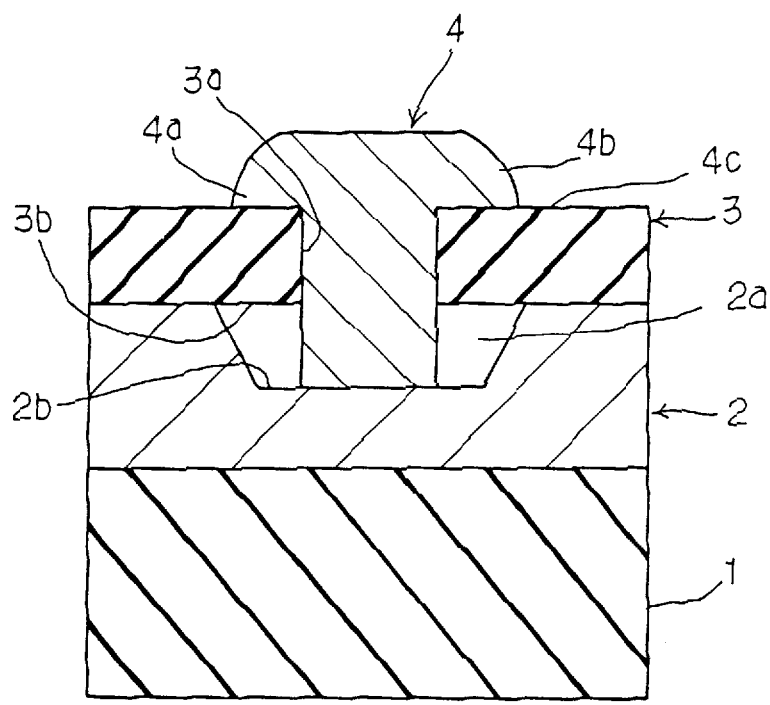
FIG. 1 is a cross sectional view showing the structure of the prior art gate electrode.
Figure 2:
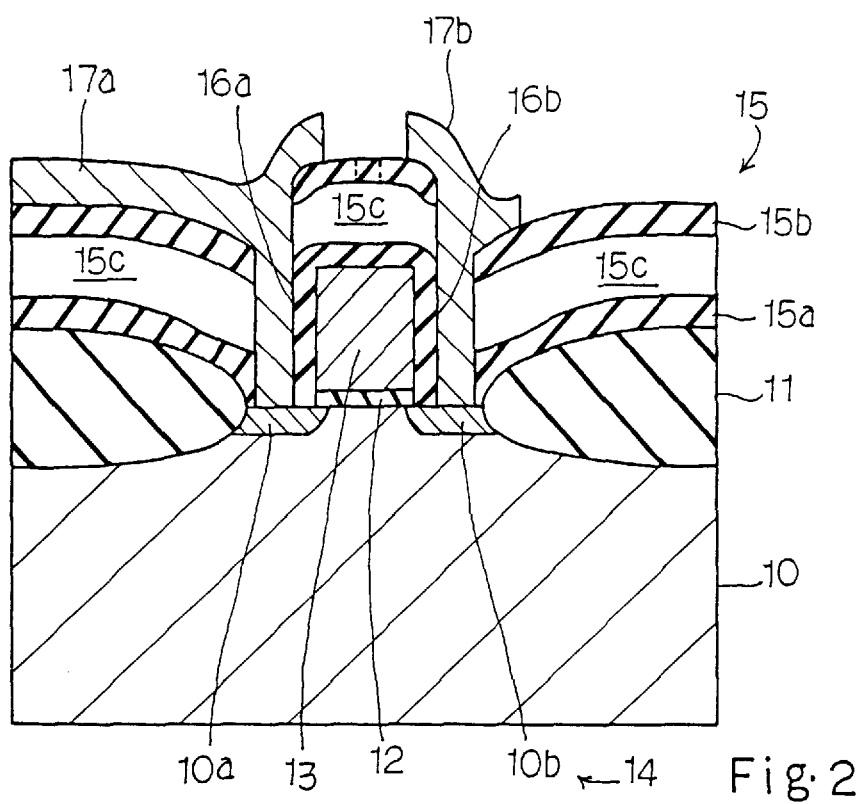
FIG. 2 is a cross sectional view showing the structure of a semiconductor device having a gaseous isolating layer according to the present invention.

Referring to FIG. 2 of the present invention, a semiconductor device embodying the present invention is fabricated on a silicon substrate 10. A thick field oxide layer 11 is selectively grown on the major surface of the silicon substrate 10, and defines an active area in the major surface. A source region 10a and a drain region 10b are formed in the active area, and are spaced apart from one another. A thin gate insulating layer 12 is formed on the active area between the source region 10a and the drain region 10b, and a conductive gate electrode 13 is patterned on the gate insulating layer 12.

The silicon substrate 10 forms p-n junctions with the source and drain regions 10a and 10b, and the p-n junctions are reversely biased so as to confine an electric signal in the source and drain regions 10a and 10b. The source and drain regions 10a and 10b, the gate insulating layer 12 and the gate electrode 13 as a whole constitute a field effect transistor which in turn forms a part of an integrated circuit together with other circuit components (not shown).

An inter-level insulating layer 15 extends over the thick field oxide layer 11, the active area and the gate electrode 13, and includes a lower insulating layer 15a of silicon oxide, an upper insulating layer 15b of silicon oxide spaced apart from the lower insulating layer 15a and the air filling a gap 15c between the lower insulating layer 15a and the upper insulating layer 15b. The silicon oxide is intentionally undoped, and the term "intentionally undoped" is representative of a difference from intentionally doped silicon oxide such as boro-phosphosilicate glass.

Contact holes 16a and 16b are formed in the inter-level insulating layer 15, and the source and drain regions 10a and 10b are exposed to the contact holes 16a and 16b, respectively. Conductive wirings 17a and 17b of aluminum alloy are formed on the inter-level insulating layer 15, and are held in contact through the contact holes 16a and 16b with the source and drain regions 10a and 10b, respectively. The upper insulating layer 15b is bonded to the conductive wirings 17a and 17b, and is supported by the conductive wirings 17a and 17b. For this reason, the upper insulating layer 15b does not fall down on the lower insulating layer 15a without any physical contact between the lower insulating layer 15a and the upper insulating layer 15b.

In this instance, the gate electrode 13 and the conductive wirings 17a/17b serve as a first conductive layer and a second conductive layer, respectively, and a gaseous isolating layer is implemented by the air filling the gap 15c.

The effective dielectric constant e of the three-level inter-level insulating layer 15, i.e., the lower and upper insulating layers 15a and 15b and the air in the gap 15c is expressed by Equation 1.

$$e = e1\ e2\ e3\ (t1+t2+t3)/(t1\ e2\ e3+t2\ e1\ e3+t3\ e1\ e2) \quad \text{Equation 1}$$

where t1 is the thickness of the lower insulating layer 15a, t2 is the thickness of the air, t3 is the thickness of the upper insulating layer 15b, e1 is the dielectric constant of the lower insulating layer 15a, e2 is the dielectric constant of the air and e3 is the dielectric constant of the upper insulating layer 15b. The silicon oxide has the dielectric constant of 3.6, and the dielectric constant of the air is 1.0. When the each of the lower and upper insulating layers 15a and 15b is 100 nanometers thick and the air layer is 300 nanometers thick, the effective dielectric constant e is of the order of 1.4, and is decreased to $\frac{1}{2.6}$ of the dielectric constant of the silicon oxide. Using the inter-level insulating layer 15, it is possible to drastically decrease the parasitic capacitance between the gate electrode 13 and the conductive wirings.

Description is hereinbelow made on the semiconductor device shown in FIG. 2 with reference to FIGS. 3A to 3G. The process starts with preparation of the silicon substrate 10, and the thick field oxide layer 11 is selectively grown on the major surface of the silicon substrate 10. The thick field oxide layer 11 defines an active area assigned to the field effect transistor 14 in the major surface.

A thin silicon oxide layer is thermally grown on the active area, and conductive substance such as polysilicon is deposited over the entire surface of the structure. The thin silicon oxide layer is overlain by the polysilicon layer, and an appropriate photo-resist etching mask (not shown) is patterned on the polysilicon layer by using lithographic techniques. The polysilicon layer is selectively etched away, and the gate electrode 13 is formed beneath the photo-resist etching mask.

Figure 3A:
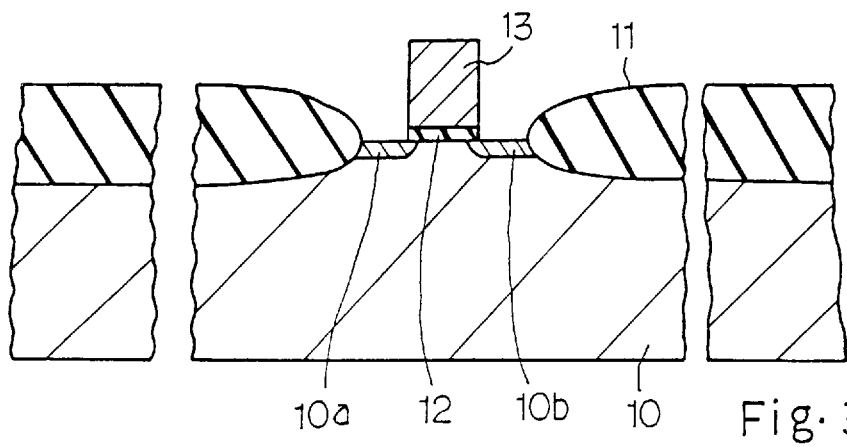
FIGS. 3A to 3I are cross sectional views showing a process of fabricating the semiconductor device according to the present invention.

The photo-resist etching mask is stripped off, and dopant impurity is ion implanted into the active area and the gate electrode 13. The dopant impurity is opposite in conductivity to the silicon substrate 10, and the source and drain regions 10a and 10b are formed in the active area in a self-aligned manner with the gate electrode 13. The thin silicon oxide layer is selectively etched away, and the thin gate insulating layer 12 is left beneath the gate electrode 13 as shown in FIG. 3A.

Figure 3B:
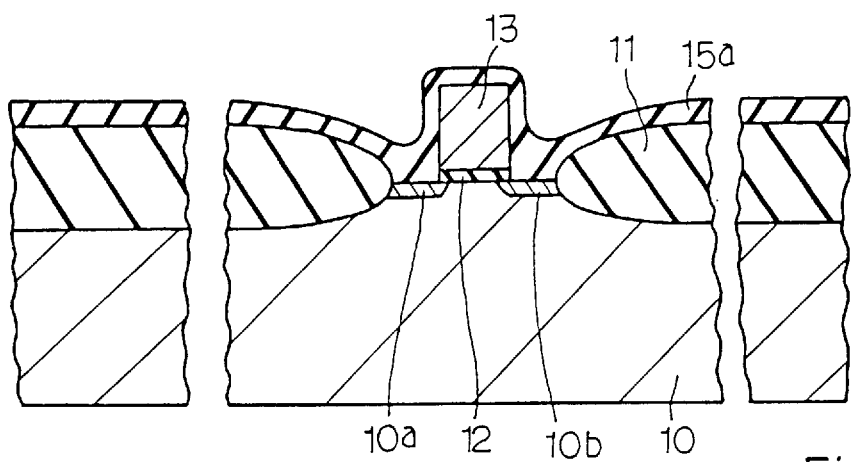

Subsequently, silicon oxide is deposited over the entire surface of the resultant structure by using a chemical vapor deposition, and the resultant structure is overlain by the lower insulating layer 15a as shown in FIG. 3B.

Figure 3C:
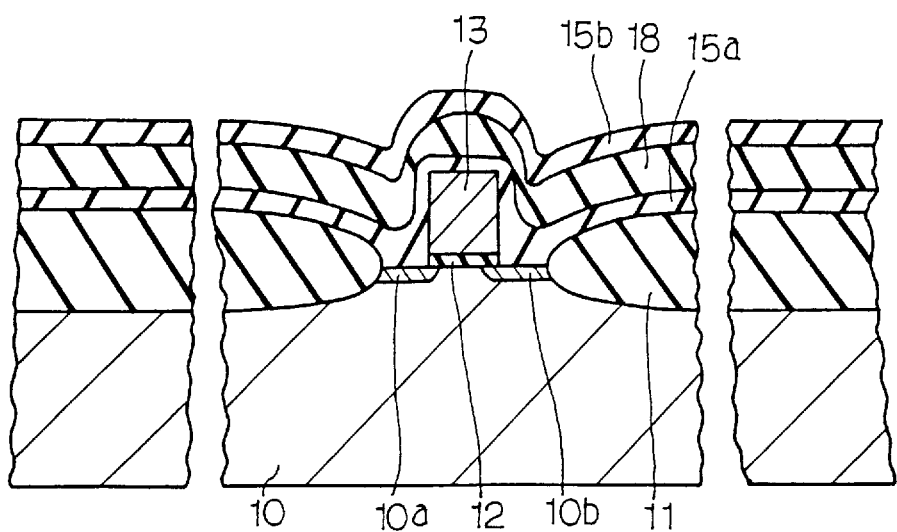

Boro-phosphosilicate glass is deposited over the lower insulating layer 15a by using a chemical vapor deposition, and the lower insulating layer 15a is overlain by a boro-phosphosilicate glass layer 18. Silicon oxide is deposited over the boro-phosphosilicate glass layer 18 by using the chemical vapor deposition, again, and the boro-phosphosilicate glass layer is overlain by the upper insulating layer 15b as shown in FIG. 3C.

Figure 3D:
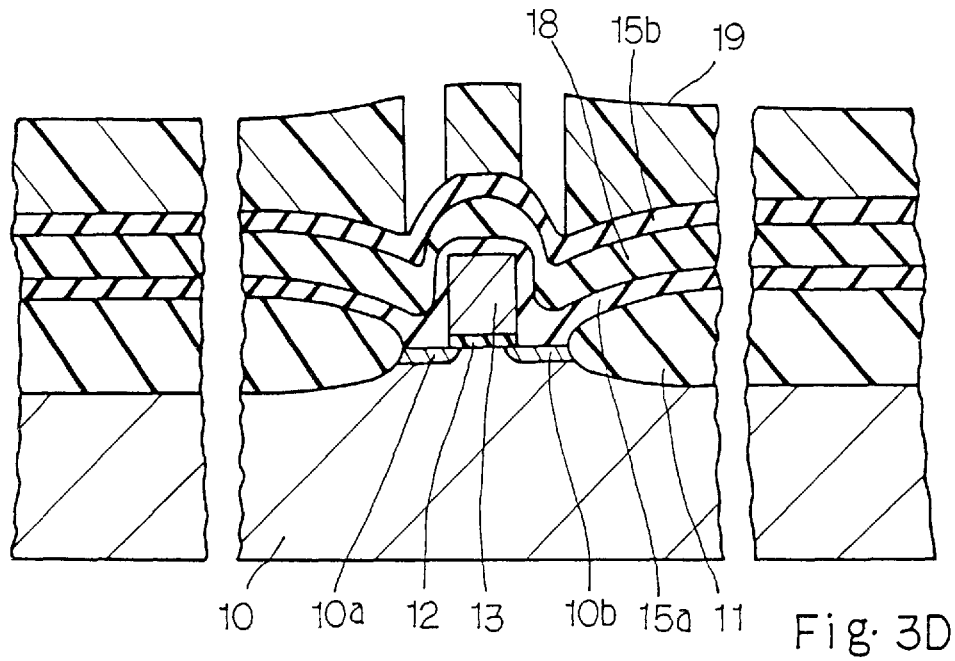

Photo-resist is spread over the entire surface of the upper insulating layer 15b, and the upper insulating layer 15b is overlain by a photo-resist layer. A pattern image for the contact holes 16a/16b is transferred to the photo-resist layer, and the photo-resist layer is patterned to a photo-resist mask 19 through a development as shown in FIG. 3D.

Figure 3E:
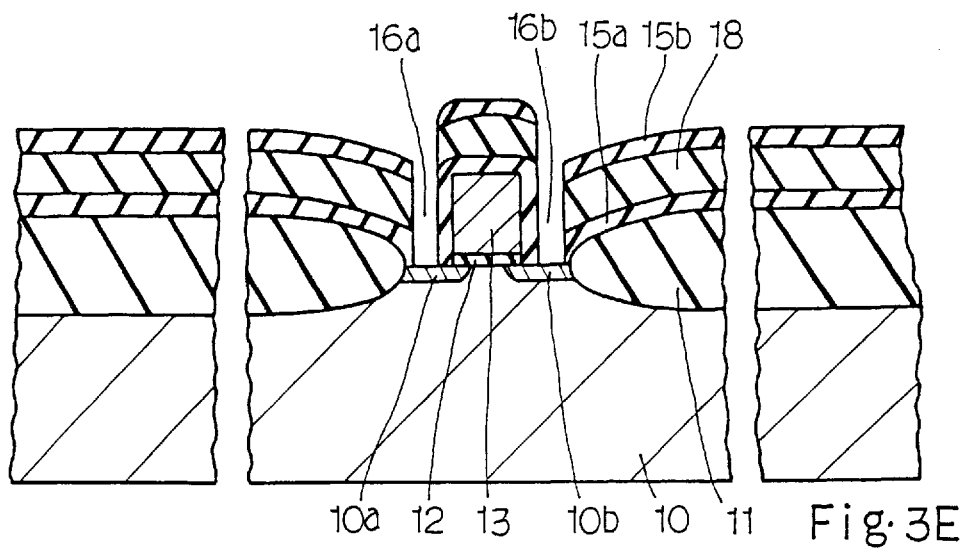

Using the photo-resist mask 19, the upper insulating layer 15b, the boro-phosphosilicate glass layer 18 and the lower insulating layer 15a are selectively etched through a dry etching technique. The dry etching forms the contact holes 16a and 16b, and the source and drain regions 10a and 10b are exposed to the contact holes 16a and 16b as shown in FIG. 3E.

Figure 3F:
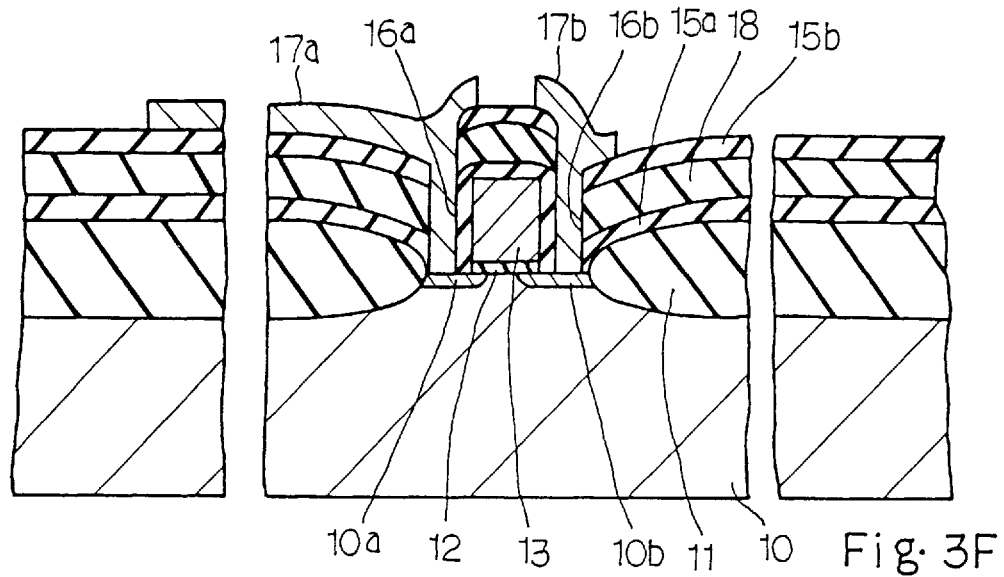

Subsequently, aluminum alloy is deposited over the entire surface of the resultant structure. The aluminum alloy fills the contact holes 16a and 16b, and swells into an aluminum alloy layer extending over the upper insulating layer 15b. Photo-resist is spread over the entire surface of the aluminum alloy layer, and a pattern image for the conductive wirings 17a and 17b is transferred to the photo-resist layer. The photo-resist layer is developed into a photo-resist etching mask (not shown). Using the photo-resist etching mask, the aluminum alloy layer is selectively etched away, and is patterned into the conductive wirings 17a and 17b as shown in FIG. 3F. The conductive wirings 17a and 17b stand on the source and drain regions 10a and 10b, respectively, and are strongly bonded to the upper insulating layer 15b.

Figure 3G:
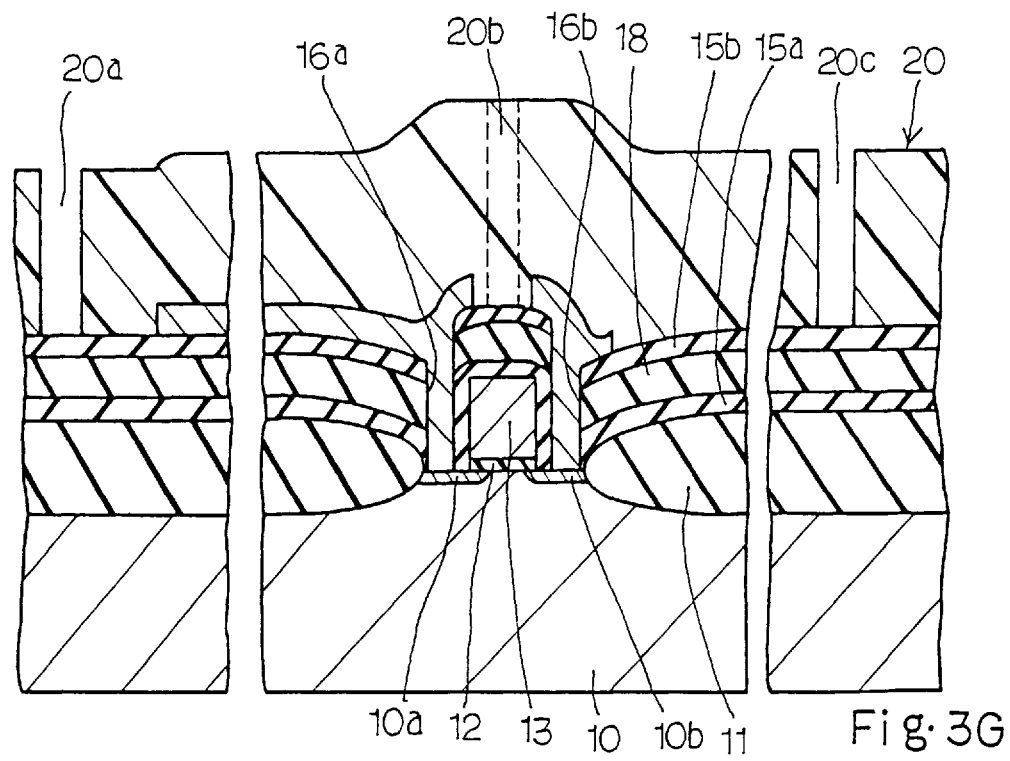

The photo-resist etching mask is stripped off, and photo-resist is spread over the entire surface of the resultant structure, again. A pattern image for vent holes is transferred to the photo-resist layer, and the photo-resist layer is developed into a photo-resist etching mask 20. The photo-resist etching mask 20 has holes 20a, 20b and 20c, and areas of the upper insulating layer 15b are exposed to the holes 20a, 20b and 20c, respectively, as shown in FIG. 3G.

Figure 3H:
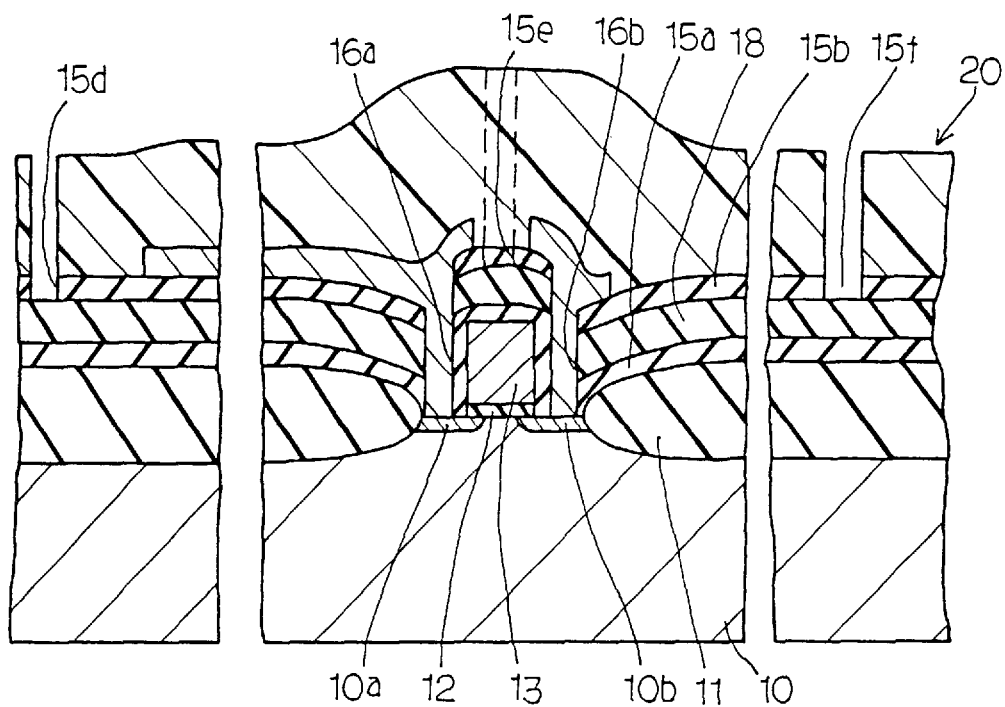

Using the photo-resist etching mask 20, the upper insulating layer 15b is selectively etched away through the dry etching, and vent holes 15d, 15e and 15f are formed in the upper insulating layer 15b as shown in FIG. 3H.

Figure 3I:
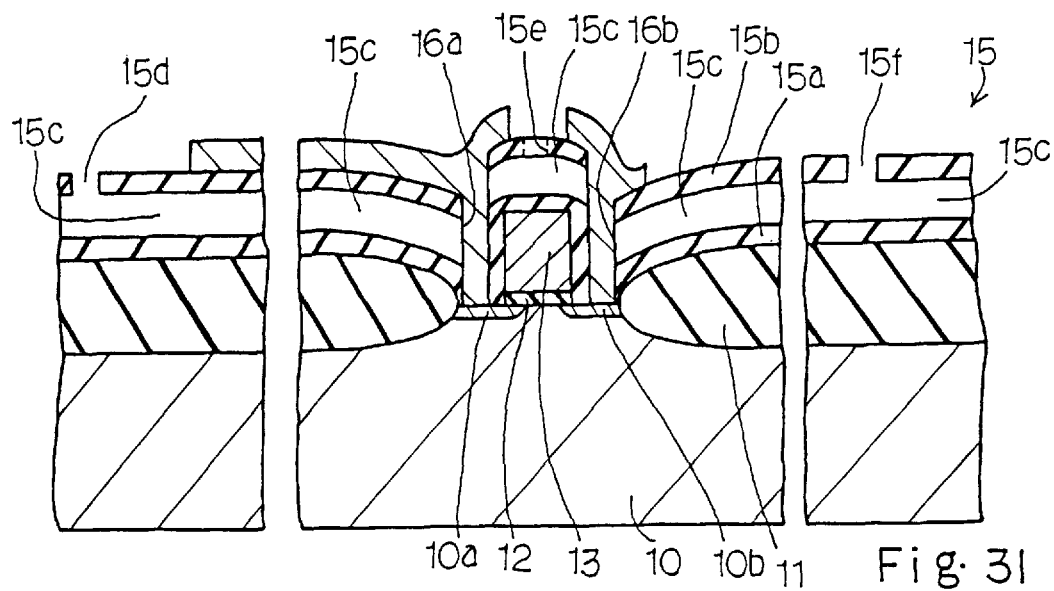

Finally, the boro-phosphosilicate glass layer 18 is etched away by using hydrogen fluoride vapor as an etchant. The hydrogen fluoride vapor penetrates through the vent holes 15d to 15f, and forms the gap 15c. The air enters through the vent holes 15d to 15f into the gap 15c, and the inter-level insulating layer 15 is completed as shown in FIG. 3I.

In this instance, the silicon oxide is first and second insulating materials, and the boro-phosphosilicate glass serves as a material.

As will be appreciated from the foregoing description, the gap 15c is formed between the lower insulating layer 15a and the upper insulating layer 15b, and the air in the gap 15c decreases the effective dielectric constant. For this reason, the inter-level insulating layer 15 according to the present invention is effective against undesirable parasitic capacitance across the inter-level insulating layer 15.

Second Embodiment

Figure 4:
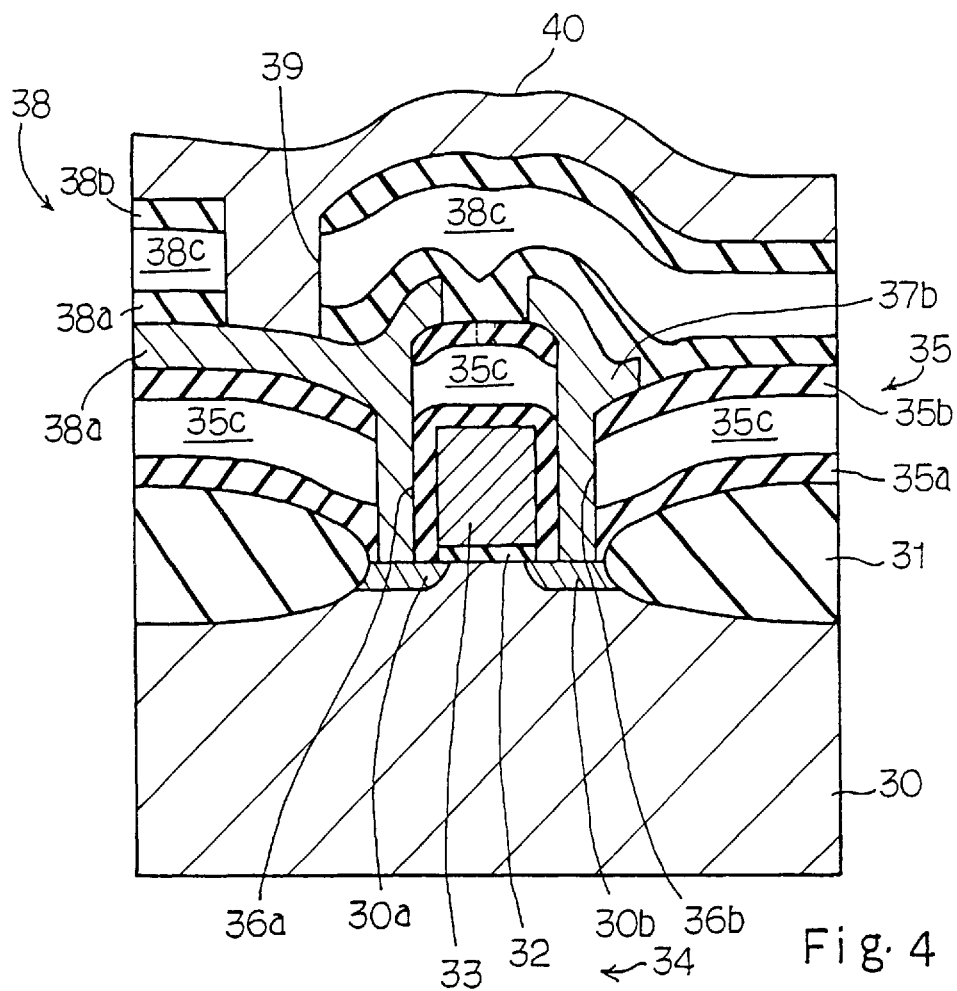
FIG. 4 is a cross sectional view showing the structure of another semiconductor device according to the present invention.

Turning to FIG. 4 of the drawings, another semiconductor device embodying the present invention is fabricated on a silicon substrate 30. A thick field oxide layer 31 is selectively grown on the major surface of the silicon substrate 30, and defines an active area in the major surface. A source region 30a and a drain region 30b are formed in the active area, and are spaced apart from one another. A thin gate insulating layer 32 is formed on the active area between the source region 30a and the drain region 30b, and a conductive gate electrode 33 is patterned on the gate insulating layer 32.

The source and drain regions 30a and 30b, the gate insulating layer 32 and the gate electrode 33 as a whole constitute a field effect transistor 34 which in turn forms a part of an integrated circuit together with other circuit components (not shown).

A first inter-level insulating layer 35 extends over the thick field oxide layer 31, the active area and the gate electrode 33, and includes a lower insulating layer 35a of silicon oxide, an upper insulating layer 35b of silicon oxide spaced apart from the lower insulating layer 35a and the air filling a gap 35c between the lower insulating layer 35a and the upper insulating layer 35b.

Contact holes 36a and 36b are formed in the first inter-level insulating layer 35, and the source and drain regions 30a and 30b are exposed to the contact holes 36a and 36b, respectively. Lower conductive wirings 37a and 37b are formed on the inter-level insulating layer 35, and are held in contact through the contact holes 36a and 36b with the source and drain regions 30a and 30b, respectively. The upper insulating layer 35b is bonded to the lower conductive wirings 37a and 37b, and is supported by the lower conductive wirings 37a and 37b. For this reason, the upper insulating layer 35b does not fall down on the lower insulating layer 35a without any physical contact therebetween.

The first inter-level insulating layer 35 and the lower conductive wirings 37a and 37b are overlain by a second inter-level insulating layer 38, and the second inter-level insulating layer 38 includes a lower insulating layer 38a of silicon oxide, an upper insulating layer 38b of silicon oxide and the air filling a gap 38c between the lower insulating layer 38a and the upper insulating layer 38b.

A contact hole 39 is formed in the second inter-level insulating layer 38, and the lower conductive wiring 37a is exposed to the contact hole 39. An upper conductive wiring of aluminum alloy extends over the second inter-level insulating layer 38, and is held in contact with the lower conductive wiring 37a through the contact hole 39. The upper conductive wiring 40 is strongly bonded to the upper insulating layer 38b, and the upper insulating layer 38b is supported through the upper conductive wiring 40 by the lower conductive wiring 37a. For this reason, even through the upper insulating layer 38b is not physically connected to the lower insulating layer 38a, the upper insulating layer 38b never falls down on the lower insulating layer 38a.

The second inter-level insulating layer 38 is as small in effective dielectric constant as the first inter-level insulating layer 35, and drastically decreases the parasitic capacitance between the lower conductive wirings 37a/37b and the upper conductive wiring 40.

In this instance, the present invention is applied to a lower multi-layer wiring structure 33/35/37a/37b and an upper multi-layer wiring structure 37a/37b/38/40. In the upper multi-layer wiring structure, the lower conductive wirings 37a/37b and the upper conductive wiring 40 serve as a first conductive layer and a second conductive layer, respectively.

Figure 5A:
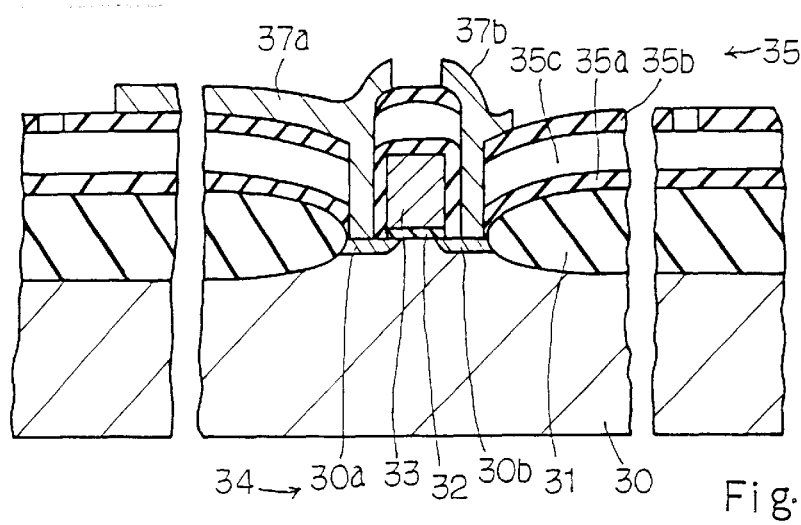
FIGS. 5A to 5I are cross sectional views showing a process for fabricating the semiconductor device shown in FIG. 4.

The semiconductor device shown in FIG. 4 is fabricated as follows. The process sequence is similar to the process for the first embodiment until the formation of the lower conductive wirings 37a/37b, and the resultant structure is illustrated in FIG. 5A.

Figure 5B:
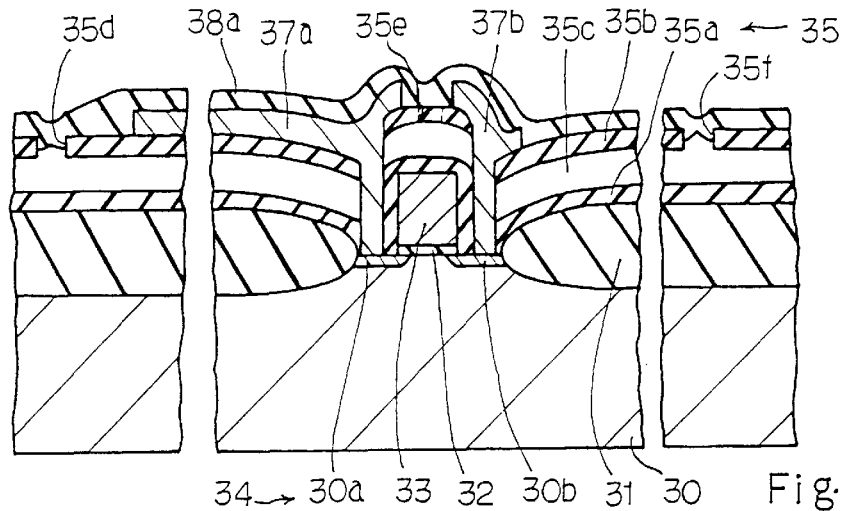

Subsequently, intentionally undoped silicon oxide is deposited over the entire surface of the resultant structure shown in FIG. 5A, and the first inter-level insulating layer 35 and the lower conductive wirings 37a/37b are covered with the lower insulating layer 38a as shown in FIG. 5B. While the intentionally undoped silicon oxide is being deposited, the intentionally undoped silicon oxide clogs the air vent holes 35d, 35e and 35f, because the air vent holes 35d to 35f are extremely small.

Figure 5C:
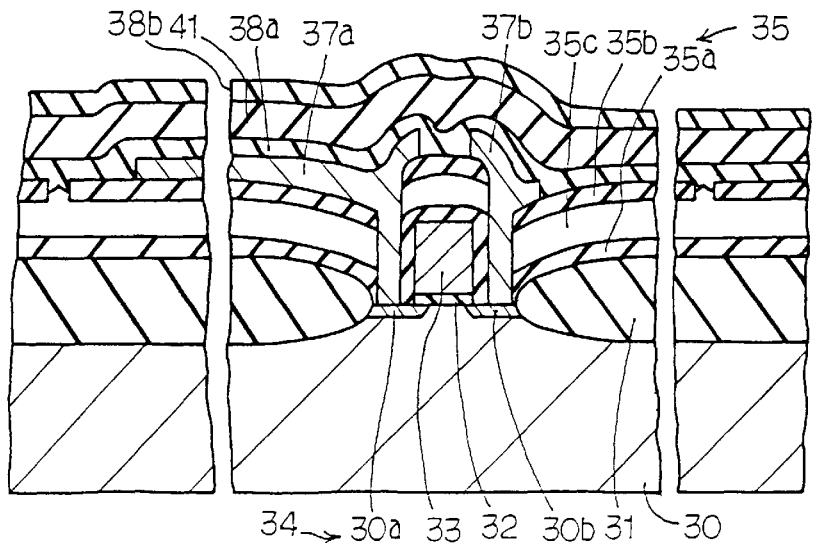

Subsequently, boro-phosphosilicate glass is deposited over the lower insulating layer 38a by using the chemical vapor deposition, and the lower insulating layer 38a is overlain by a boro-phosphosilicate glass layer 41. Silicon oxide is deposited over the boro-phosphosilicate glass layer 41 by using the chemical vapor deposition, and the boro-phosphosilicate glass layer 41 is overlain by the upper insulating layer 38b as shown in FIG. 5C.

Figure 5D:
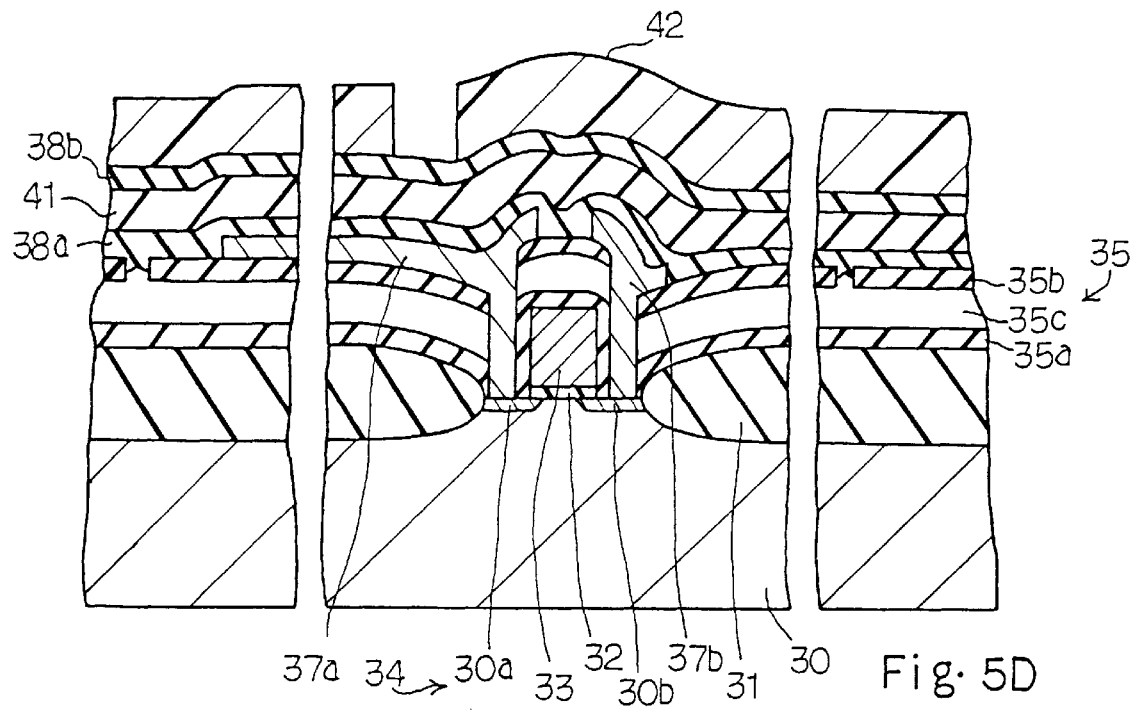

Photo-resist is spread over the entire surface of the upper insulating layer 38 and the upper insulating layer 38b is overlain by a photo-resist layer. A pattern image for the contact hole 39 is transferred to the photo-resist layer, and the photo-resist layer is patterned to a photo-resist mask 42 through a development as shown in FIG. 5D.

Figure 5E:
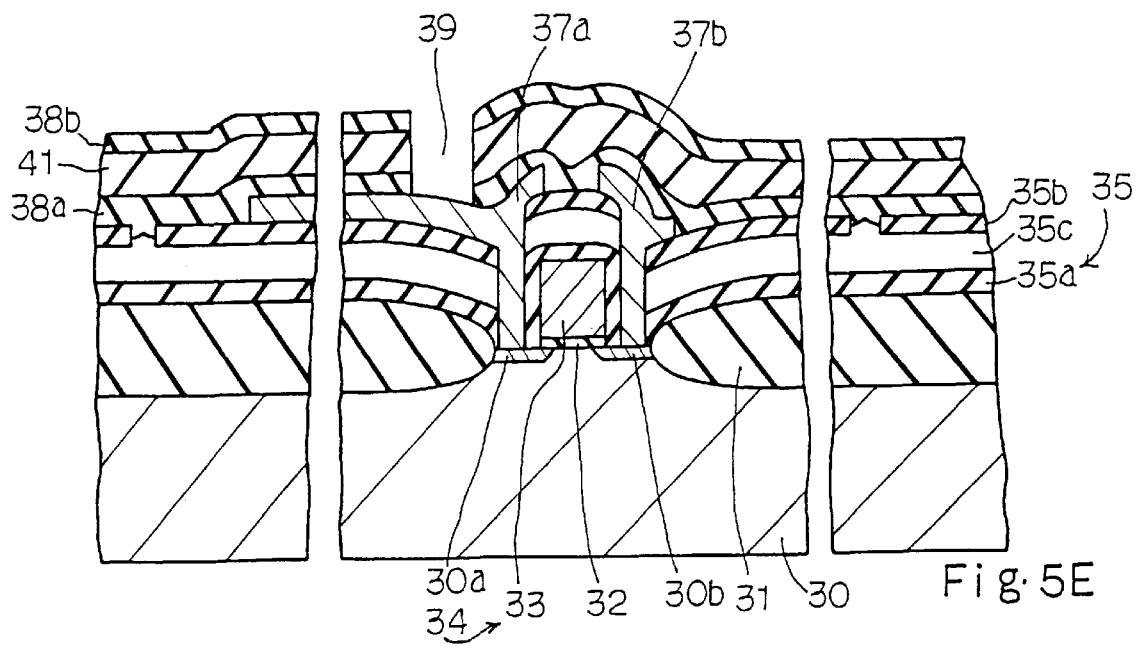

Using the photo-resist mask 42, the upper insulating layer 38b, the boro-phosphosilicate glass layer 41 and the lower insulating layer 38a are selectively etched through a dry etching technique. The dry etching forms the contact hole 39, and the lower conductive wiring 37a is exposed to the contact hole 39 as shown in FIG. 5E.

Figure 5F:
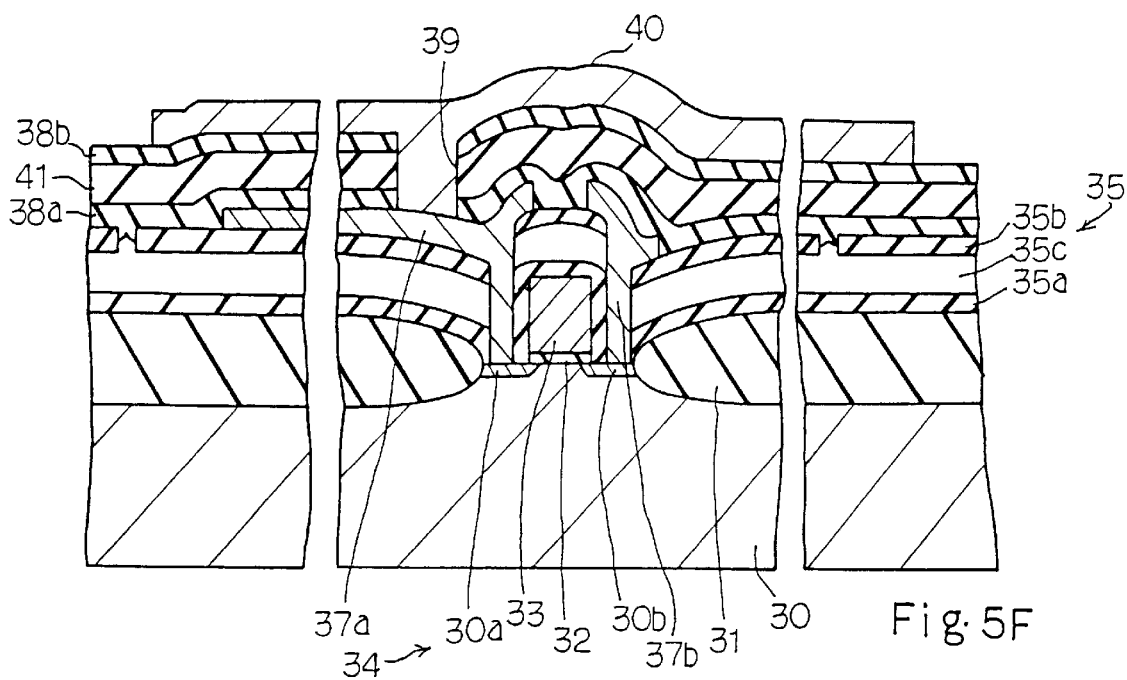

Subsequently, aluminum alloy is deposited over the entire surface of the resultant structure shown in FIG. 5E. The aluminum alloy fills the contact holes 39, and swells into an aluminum alloy layer extending over the upper insulating layer 38b. Photo-resist is spread over the entire surface of the aluminum alloy layer, and a pattern image for the upper conductive wiring 40 is transferred to the photo-resist layer. The photo-resist layer is developed into a photo-resist etching mask (not shown). Using the photo-resist etching mask, the aluminum alloy layer is selectively etched away, ad is patterned into the upper conductive wiring 40 as shown in FIG. 5F. The upper conductive wiring 40 stands on the lower conductive wiring 37a, and is strongly bonded to the upper insulating layer 38b.

Figure 5G:
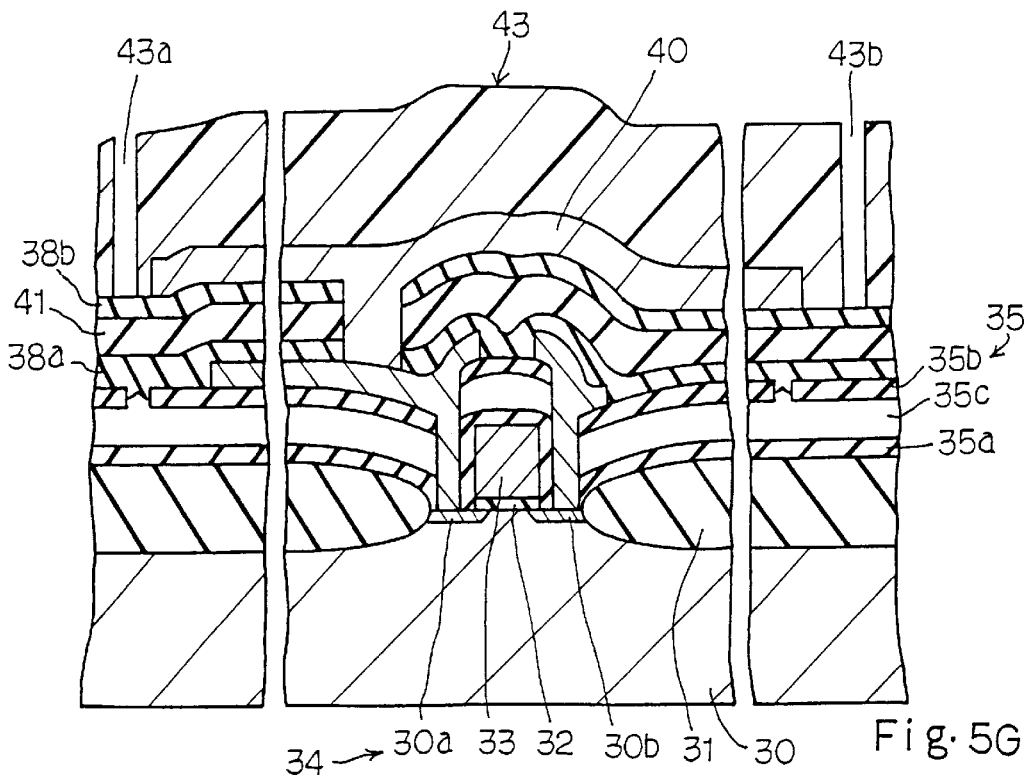

The photo-resist etching mask is stripped off, and photo-resist is spread over the entire surface of the resultant structure, again. A pattern image for vent holes is transferred to the photo-resist layer, and the photo-resist layer is developed into a photo-resist etching mask 43. The photo-resist etching mask 43 has holes 43a and 43b, and areas of the upper insulating layer 38b are exposed to the holes 43a and 43b, respectively, as shown in FIG. 5G.

Figure 5H:
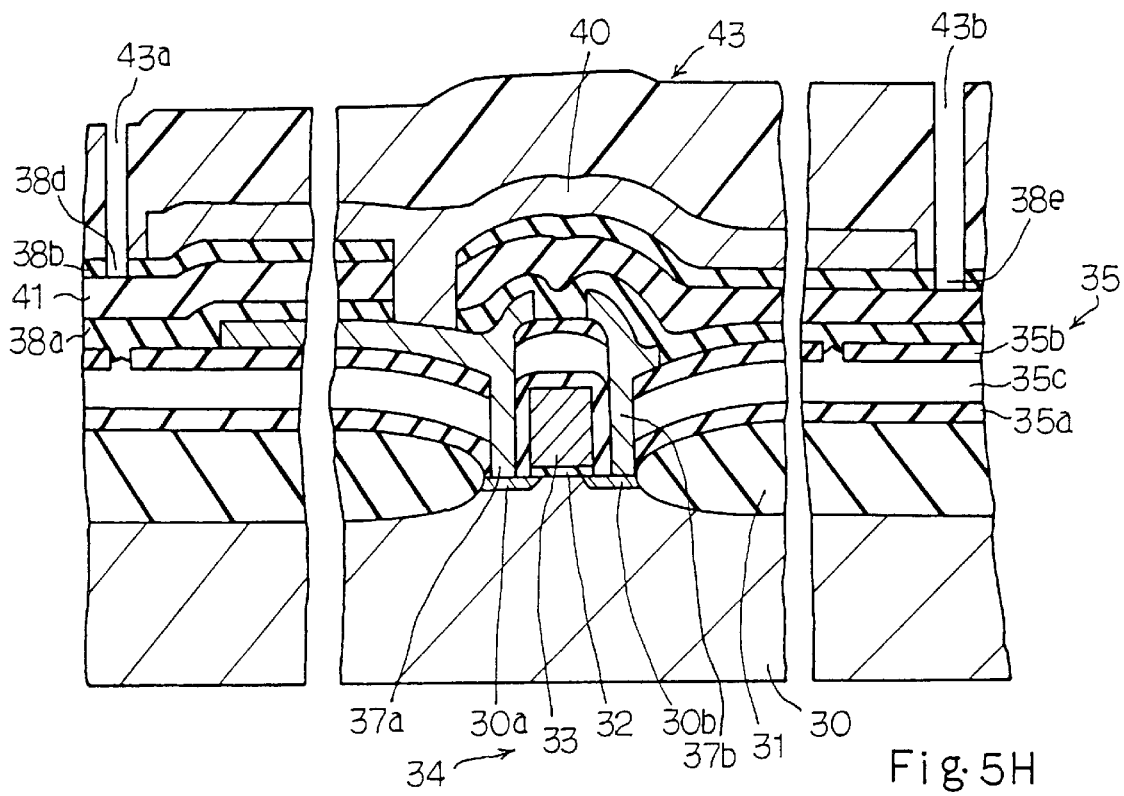

Using the photo-resist etching mask 43, the upper insulating layer 38b is selectively etched away through the dry etching, and vent holes 38d and 38e are formed in the upper insulating layer 38b as shown in FIG. 5H.

Figure 5I:
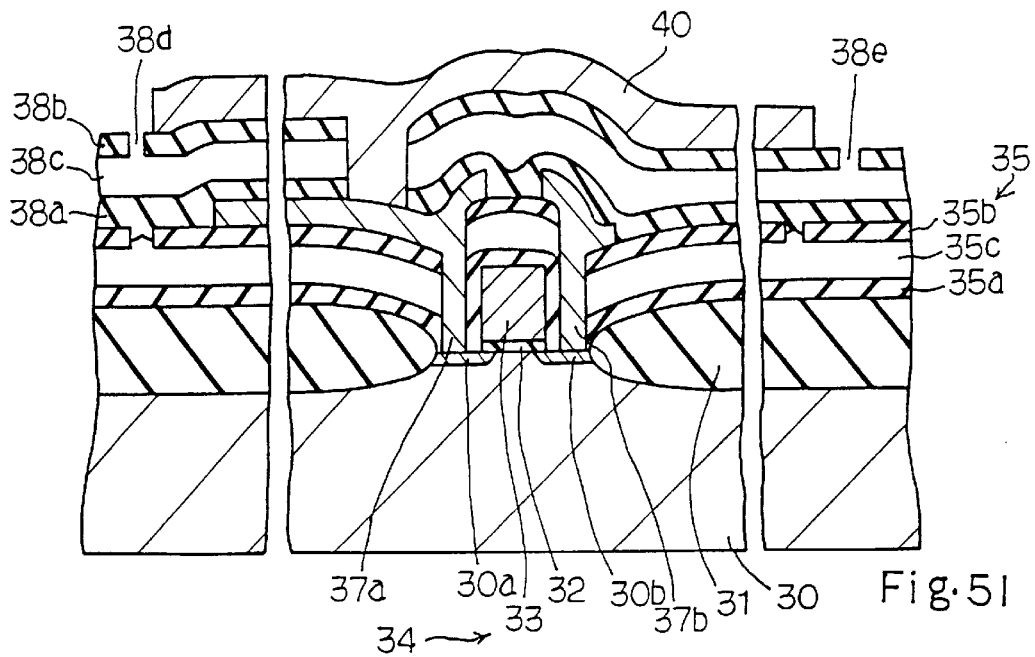

Finally, the boro-phosphosilicate glass layer 41 is etched away by using hydrogen fluoride vapor as an etchant. The hydrogen fluoride vapor penetrates through the vent holes 38d and 38e, and forms the gap 38c. The air enters through the vent holes 38d and 38e into the gap 38c, and the second inter-level insulating layer 38 is completed as shown in FIG. 5I.

Although particular embodiments of the present invention have been shown and described, it will be obvious to those skilled in the art that various changes and modifications may be made without departing from the spirit and scope of the present invention.

For example, phosphosilicate glass and boro-silicate glass are available for the insulating layers 18 and 41, and the upper and lower insulating layers 15a/15b, 35a/35b and 38a/38b may be formed of silicon nitride.

Finally, the inter-level insulating layer according to the present invention may be formed over any circuit components such as, for example, bipolar transistors.

What is claimed is:

1. A semiconductor device comprising:
   a first conductive layer and a second conductive layer; and
   an inter-level insulating layer provided between said first conductive layer and said second conductive layer so as to form a parasitic capacitor together with said first conductive layer and said second conductive layer, and including a first insulating layer, a second insulating layer spaced from said first insulating layer for forming a gap and a gaseous isolating layer filling said gap,
   said first conductive layer and said second conductive layer serving as a gate electrode and a signal wiring bonded to said second insulating layer of said inter-level insulating layer,
   said first conductive layer forming a field effect transistor together with source and drain regions formed in a semiconductor layer and a gate insulating layer between said semiconductor layer and said gate electrode.

2. The semiconductor device as set forth in claim 1, in which said signal wiring passes through a contact hole formed in said inter-level insulating layer, and is held in contact with one of said source and drain regions so that said second insulating layer is supported through said signal wiring by said one of said source and drain regions.

3. A semiconductor device comprising:
   a first conductive layer and a second conductive layer; and
   an inter-level insulating layer provided between said first conductive layer and said second conductive layer so as to form a parasitic capacitor together with said first conductive layer and said second conductive layer, and including a first insulating layer, a second insulating layer spaced from said first insulating layer for forming a gap and a gaseous isolating layer filing said gap,
   said first conductive layer and said second conductive layer serving as a lower wiring layer and an upper wiring layer extending over said inter-level insulating layer.

* * * * *